(12) United States Patent
Lin et al.

(10) Patent No.: US 9,030,093 B2
(45) Date of Patent: May 12, 2015

(54) ORGANIC ELECTROLUMINESCENT DEVICE AND TRANSPARENT IMPEDANCE LINE

(71) Applicant: Au Optronics Corporation, Hsinchu (TW)

(72) Inventors: Chen-Chi Lin, Hsinchu County (TW); Chieh-Wei Chen, Taichung (TW); Yuan-Chen Chin, Hsinchu County (TW); Chun-Liang Lin, New Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/717,710

(22) Filed: Dec. 18, 2012

(65) Prior Publication Data
US 2013/0154472 A1    Jun. 20, 2013

(30) Foreign Application Priority Data
Dec. 20, 2011    (TW) .............................. 100147475 A

(51) Int. Cl.
*H05B 33/12*    (2006.01)
*H01L 23/64*    (2006.01)

(52) U.S. Cl.
CPC ................ *H05B 33/12* (2013.01); *H01L 23/64* (2013.01); *H01L 2924/0002* (2013.01)

(58) Field of Classification Search
CPC ..................................................... H01L 23/64
USPC ......................................................... 313/504
See application file for complete search history.

(56) References Cited

U.S. PATENT DOCUMENTS

| | | | |
|---|---|---|---|
| 6,995,035 B2* | 2/2006 | Cok et al. | 438/82 |
| 7,528,544 B2* | 5/2009 | Kwak et al. | 313/506 |
| 7,777,406 B2 | 8/2010 | Son | |
| 2004/0183067 A1* | 9/2004 | Strip | 257/40 |
| 2006/0066223 A1* | 3/2006 | Pschenitzka | 313/504 |
| 2008/0143250 A1* | 6/2008 | Blochwitz-Nimoth et al. | 313/504 |
| 2009/0195723 A1* | 8/2009 | Araki et al. | 349/43 |
| 2010/0117523 A1* | 5/2010 | Tchakarov | 313/504 |

OTHER PUBLICATIONS

"Office Action of China Counterpart Application", issued on Apr. 4, 2014, p. 1-6, in which the listed reference was cited.

* cited by examiner

*Primary Examiner* — Nimeshkumar Patel
*Assistant Examiner* — Jacob R Stern
(74) *Attorney, Agent, or Firm* — Jianq Chyun IP Office

(57) ABSTRACT

An organic electroluminescent device including an electrode line, a transparent impedance line, an insulating layer, a transparent electrode, an organic illumination layer and an electrode is provided. The electrode line is disposed on a substrate and next to a luminescent zone. The transparent impedance line is disposed in the luminescent zone on the substrate and electrically connected to the electrode line. The insulating layer completely covers the substrate and has a contact hole. The transparent electrode completely covers the luminescent zone and is disposed on the insulating layer. The transparent impedance line and the transparent electrode are electrically connected to each other through the contact hole. The organic illumination layer is disposed on the transparent electrode. The electrode is disposed on the organic illumination layer. Thus, the illumination of the organic electroluminescent device can be more uniform and the aperture ratio is increased.

11 Claims, 4 Drawing Sheets

ORGANIC ELECTROLUMINESCENT DEVICE AND TRANSPARENT IMPEDANCE LINE

CROSS-REFERENCE TO RELATED APPLICATION

This application claims the priority benefit of Taiwan application serial no. 100147475, filed on Dec. 20, 2011. The entirety of the above-mentioned patent application is hereby incorporated by reference herein and made a part of this specification.

BACKGROUND OF THE INVENTION

1. Field of the Invention

The present invention generally relates to a luminescent device, in particular, to an organic electroluminescent device.

2. Description of Related Art

Currently, information communication industry has become the mainstream industry, particularly various portable communication display products are key points to be developed. As a communicating interface between human and information, the development of a flat panel display is particularly important. An organic electroluminescent display is an organic electroluminescent device formed by organic light emitting diodes (OLED), and with advantages of self-emission, wide viewing angel, energy saving, simple manufacturing process, low cost, wide range of operating temperature, high response speed and full color, the organic electroluminescent display has a great potential to become the mainstream of the next generation of flat panel displays and illumination apparatuses.

The organic electroluminescent device is basically a structure of three layers, which are an anode, a luminescent layer and a cathode respectively. In a manufacturing process, a transparent electrode is deposited on a transparent glass substrate, and an organic illumination layer and a vapor deposited metal electrode are plated in sequence on the transparent electrode. However, a short circuit easily occurs between the anode and the cathode during the manufacturing process, causing that the organic electroluminescent device cannot be lighted. Besides, as the transparent electrode has a high resistance, the luminescent zone of the organic electroluminescent device often has a luminance non-uniformity problem. Moreover, both luminescence uniformity and a high aperture ratio are required to increase the luminance of the organic electroluminescent device.

SUMMARY OF THE INVENTION

Accordingly, the present invention is directed to an organic electroluminescent device, which can make the illumination more uniform and increase the aperture ratio.

The present invention provides an organic electroluminescent device, which includes an electrode line, a transparent impedance line, an insulating layer, a transparent electrode, an organic illumination layer and an electrode. The electrode line is disposed on a substrate and next to a luminescent zone. The transparent impedance line is disposed in the luminescent zone on the substrate and electrically connected to the electrode line. The insulating layer completely covers the substrate and has a contact hole. The transparent electrode completely covers the luminescent zone and is disposed on the insulating layer. The transparent impedance line and the transparent electrode are electrically connected to each other through the contact hole. The organic illumination layer is disposed on the transparent electrode. The electrode is disposed on the organic illumination layer.

In an embodiment of the present invention, the electrode line is disposed on the substrate and contacts the transparent impedance line.

In an embodiment of the present invention, the insulating layer covers the transparent impedance line and the electrode line.

In an embodiment of the present invention, the transparent electrode, the organic illumination layer and the electrode are stacked in sequence on the insulating layer.

In an embodiment of the present invention, the transparent electrode is stacked above the transparent impedance line.

In an embodiment of the present invention, the organic electroluminescent device further includes a patterned transparent conductive layer. The patterned transparent conductive layer is located at the same layer as the transparent impedance line and only connected to one end of the transparent impedance line away from the contact hole. The patterned transparent conductive layer is disposed in an area in the luminescent zone surrounding the transparent impedance line, and the patterned transparent conductive layer contacts the electrode line.

In an embodiment of the present invention, the electrode line is disposed on the substrate and a part of the patterned transparent conductive layer overlaps the electrode line.

In an embodiment of the present invention, the patterned transparent conductive layer is disposed on the substrate and the electrode line overlaps a part of the patterned transparent conductive layer.

In an embodiment of the present invention, the material of the electrode line is metal or alloy.

In an embodiment of the present invention, the material of the transparent impedance line is indium tin oxide, indium zinc oxide, aluminum zinc oxide and indium gallium zinc oxide.

In an embodiment of the present invention, the material of the transparent electrode is indium tin oxide, indium zinc oxide, aluminum zinc oxide and indium gallium zinc oxide.

Based on the above, in the organic electroluminescent device of the present invention, the impedance of the entire organic electroluminescent device may be reduced by disposing a low-impedance electrode line on the substrate. The configuration of transparent impedance line may limit a current flowing through the organic electroluminescent device to avoid a short circuit, thereby improving the luminance uniformity of the luminescent zone. In addition, as the material of the transparent impedance line is light transmissive, the light emitted from the organic electroluminescent device may pass through the transparent impedance line from the transparent electrode to enlarge the emitting range of the light emitted from the organic electroluminescent device, and to increase the aperture ratio of the organic electroluminescent device. Particularly, the patterned transparent conductive layer and the transparent impedance line may be formed at the same time, and the impedance of the entire organic electroluminescent device is reduced as well. The organic electroluminescent device of the present invention has low impedance, so that the luminance non-uniformity problem of the luminescent zone may be alleviated, and at the same time the aperture ratio of the organic electroluminescent device may be increased.

In order to make the aforementioned features and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
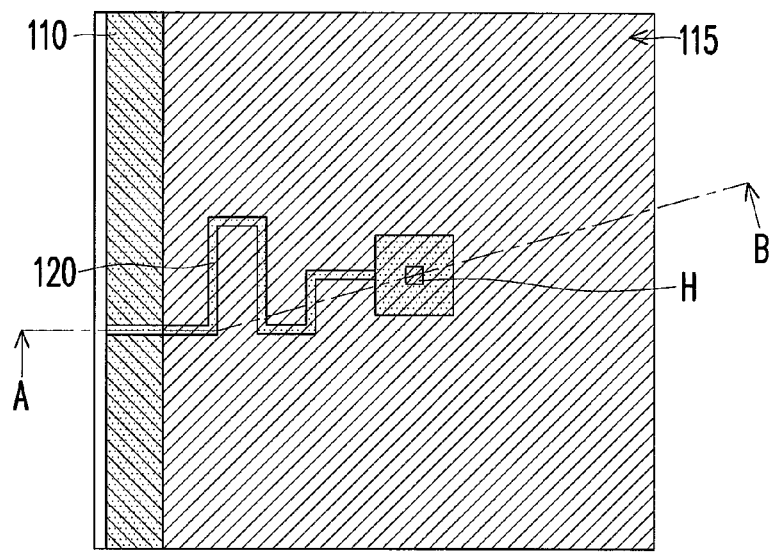
FIG. 1A is a schematic top view of an organic electroluminescent device in a first embodiment of the present invention.

Reference will now be made in detail to the present embodiments of the invention, examples of which are illustrated in the accompanying drawings. Wherever possible, the same reference numbers are used in the drawings and the description to refer to the same or like parts.

First Embodiment

Figure 1B:
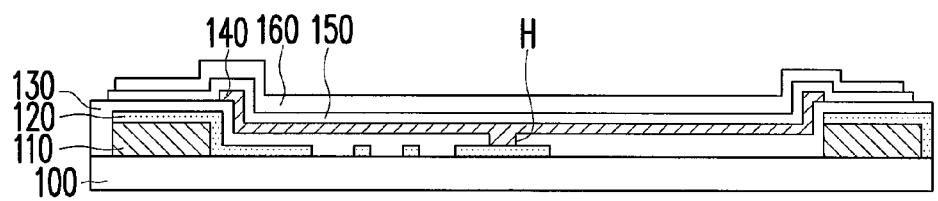
FIG. 1B is a cross-sectional view of the organic electroluminescent device in FIG. 1A along a cross-sectional line A-B.

FIG. 1A is a schematic top view of an organic electroluminescent device in the first embodiment of the present invention, and FIG. 1B is a cross-sectional view of the organic electroluminescent device in FIG. 1A along a cross-sectional line A-B. Referring to FIG. 1A and FIG. 1B, the organic electroluminescent device 10a of this embodiment includes a substrate 100, an electrode line 110, a transparent impedance line 120, an insulating layer 130, a transparent electrode 140, an organic illumination layer 150 and an electrode 160. A structure formed by the transparent electrode 140, the organic illumination layer 150 and the electrode 160 of the organic electroluminescent device 10a is also called an organic luminescent unit. Besides, a luminescent zone 115 is formed between the two neighboring electrode lines 110. The transparent impedance line 120, the insulating layer 130 and the organic luminescent unit are disposed in the luminescent zone 115 to form an organic electroluminescent area.

The electrode line 110 is disposed on the substrate 100 and next to the luminescent zone 115. In this embodiment, the electrode line 110 is formed on the substrate 110 first. The material of the substrate 100 may be glass, quartz, an organic polymer, or a flexible material to increase mechanical strength of the organic electroluminescent device 10a and to provide good light transmittance. The electrode line 110 has a low sheet resistance, so that the configuration of the electrode line 110 is not only used to transfer a current in the organic electroluminescent device 10a, but may also reduce the impedance of the entire organic electroluminescent device 10a, so as to improve the luminance uniformity of the luminescent zone. The material of the electrode line 110 may be metal, alloy or other conductive materials.

Figure 1C:
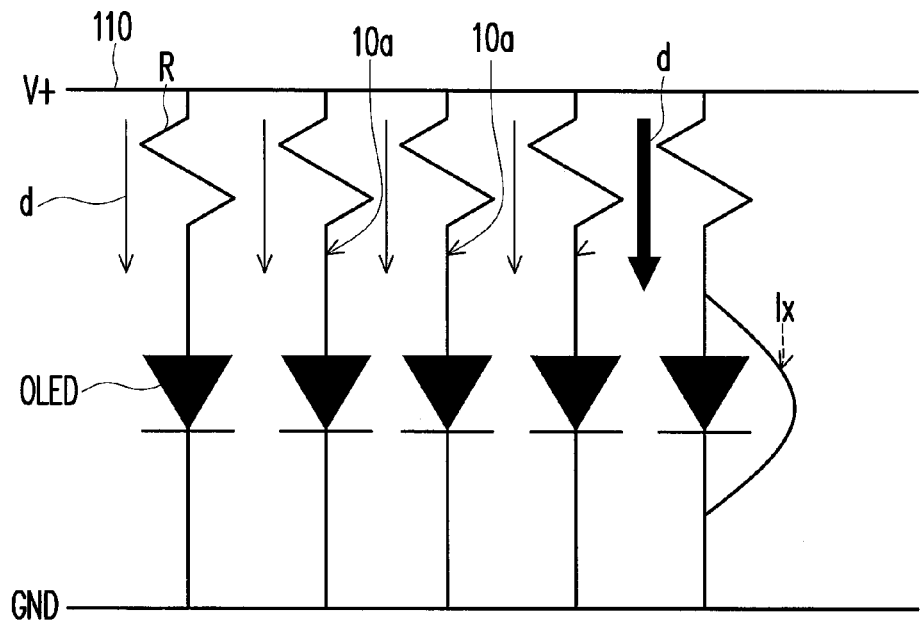
FIG. 1C is a schematic circuit diagram of multiple groups of organic electroluminescent devices.

One end of the transparent impedance line 120 overlaps the electrode line 110 and is electrically connected to the electrode line 110, and the transparent impedance line 120 is disposed in the luminescent zone 115 on the substrate 100. As the transparent impedance line 120 has high impedance, the transparent impedance line 120 may limit the current flowing through the organic electroluminescent device 10a, when a short circuit occurs to the organic electroluminescent device 10a. The material of the transparent impedance line 120 of this embodiment is, for example, indium tin oxide, indium zinc oxide, aluminum zinc oxide, indium gallium zinc oxide or other transparent conductive materials. Besides, the number of the organic electroluminescent device 10a is not limited in this embodiment. That is to say, multiple organic electroluminescent devices 10a may be connected in parallel. In detail, for example, FIG. 1C is a schematic circuit diagram of multiple groups of organic electroluminescent devices, where a resistance R represents the transparent impedance line 120 in FIG. 1A. Referring to FIG. 1A and FIG. 1C, each resistance R is connected in series to the organic luminescent unit OLED (i.e., the combination of the transparent electrode 140, the organic illumination layer 150 and the electrode 160) respectively, the neighboring organic luminescent units OLED are connected in parallel to each other, and an arrow d represents the direction of the current. In other words, the transparent impedance line 120 is connected in series to the organic luminescent unit OLED, and the transparent impedance line 120 and the organic luminescent unit OLED in each luminescent zone 115 are connected to the transparent impedance line 120 and the organic luminescent unit OLED in a neighboring luminescent zone 115 in parallel, and all of them are connected to the electrode line 110 together. Therefore, when a short circuit occurs to the organic luminescent unit OLED in an organic electroluminescent device 10a, for example, a current Lx in FIG. 1C represents a current short circuit, the transparent impedance line 120 may limit the current flowing through the organic luminescent unit OLED. In this way, the problem that other normal organic electroluminescent devices 10a cannot emit light when all currents pass through the short circuit portion may be avoided.

In the luminescent zone 115, the insulating layer 130 covers the transparent impedance line 120, and then the transparent electrode 140, the organic illumination layer 150 and the electrode 160 are stacked in sequence on the insulating layer 130, as shown in FIG. 1B. In detail, the transparent electrode 140 is stacked on the insulating layer 130 and completely covers the luminescent zone 115, i.e., the edge of the transparent electrode 140 may be disposed adjacent to the side edge of the neighboring electrode line 110 and cover the transparent impedance line 120, and the organic illumination layer 150 is disposed on the transparent electrode 140. That is to say, the organic illumination layer 150 covers the transparent electrode 140 and the insulating layer 130. The electrode 160 is disposed on the organic illumination layer 150. Referring to FIG. 1B, the insulating layer 130 disposed between the transparent impedance line 120 and the transparent electrode 140 has a contact hole H. Therefore, the transparent impedance line 120 and the transparent electrode 140 may be electrically connected to each other through the contact hole H, so that the current may flow between the electrode line 110 and the transparent electrode 140 through the contact hole H. Besides, the transparent electrode 140 and the electrode 160 of the organic luminescent unit may be an anode and a cathode respectively. The organic illumination layer 150 is disposed between the transparent electrode 140 and the electrode 160, and the organic illumination layer 150 may emit light through a combination of electrons and holes. In addition, an electron transport layer and a hole transport layer may be added according to actual needs to enhance the electron and hole transport capability. The material of the transparent electrode 140 of this embodiment may be indium tin oxide, indium zinc oxide, aluminum zinc oxide, indium gallium zinc oxide or other transparent conductive materials. When the transparent impedance line 120 is disposed in the luminescent zone 115, the transparent electrode 140 in the luminescent zone 115 may overlap the transparent impedance line 120, as shown in FIG. 1A. Therefore, the light generated by the organic luminescent unit may also pass through the area where the transparent impedance line 120 is located, so that the aperture ratio of the organic electroluminescent device 10a is increased.

Different implementations are further used to describe other designs of organic electroluminescent devices as follows. The reference numerals and some content of the foregoing embodiments are still used in the following embodiments, where the same reference numerals are used to denote the same or similar elements, and the illustration of the same technical contents is omitted. The omitted parts are as described in the foregoing embodiments, and will not be described herein again.

Second Embodiment

Figure 2:
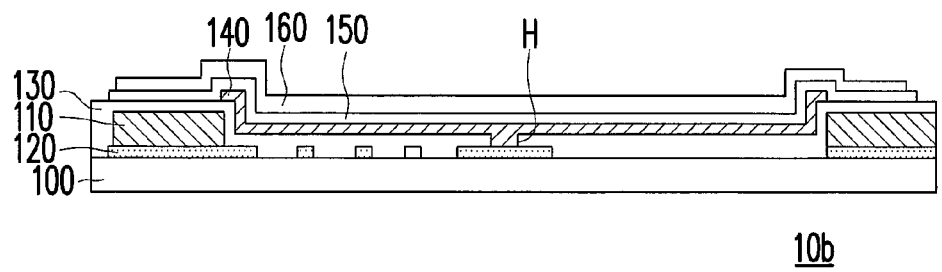
FIG. 2 is a schematic cross-sectional view of an organic electroluminescent device in a second embodiment of the present invention.

FIG. 2 is a schematic cross-sectional view of an organic electroluminescent device in the second embodiment of the present invention. Referring to FIG. 2, in the organic electroluminescent device 10b, the transparent impedance line 120 is disposed on the substrate 100 first, and the electrode line 110 is disposed on the transparent impedance line 120. In other words, in this embodiment, the transparent impedance line 120, the electrode line 110, the insulating layer 130, and the transparent electrode 140, the organic illumination layer 150 and the electrode 160 in the organic luminescent unit are disposed in sequence on the substrate 100. However, in the first embodiment, the electrode line 110 of the organic electroluminescent device 10a is formed on the substrate 100 first, and then the transparent impedance line 120 is formed, so that the transparent impedance line 120 covers the electrode line 110.

Third Embodiment

Figure 3A:
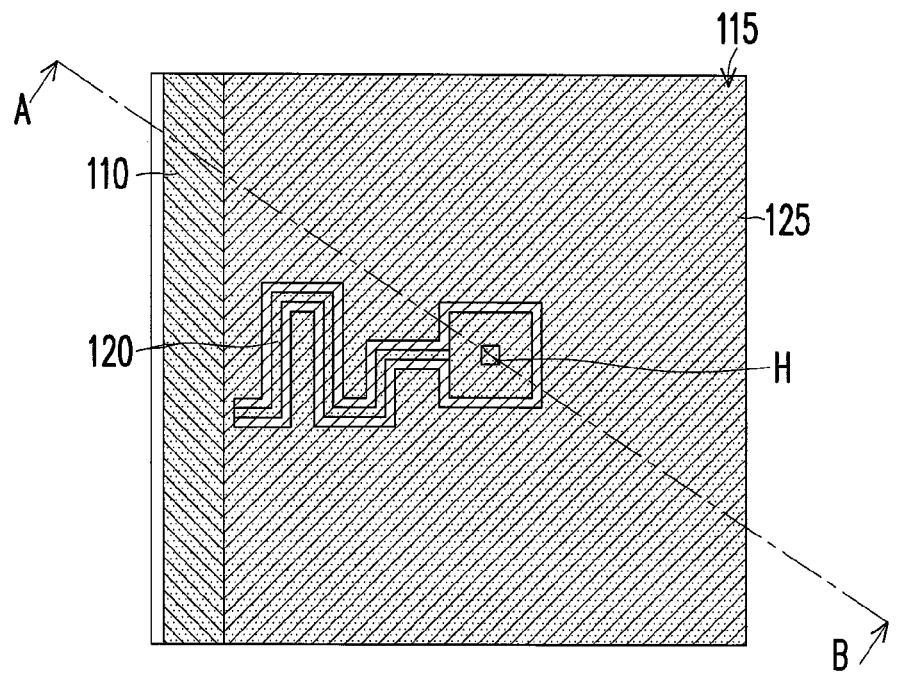
FIG. 3A is a schematic top view of an organic electroluminescent device in a third embodiment of the present invention.
Figure 3B:
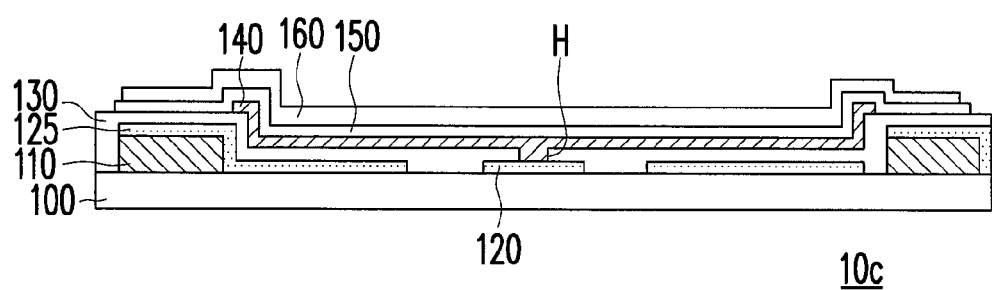
FIG. 3B is a cross-sectional view of the organic electroluminescent device in FIG. 3A along a cross-sectional line A-B.
Figure 3C:
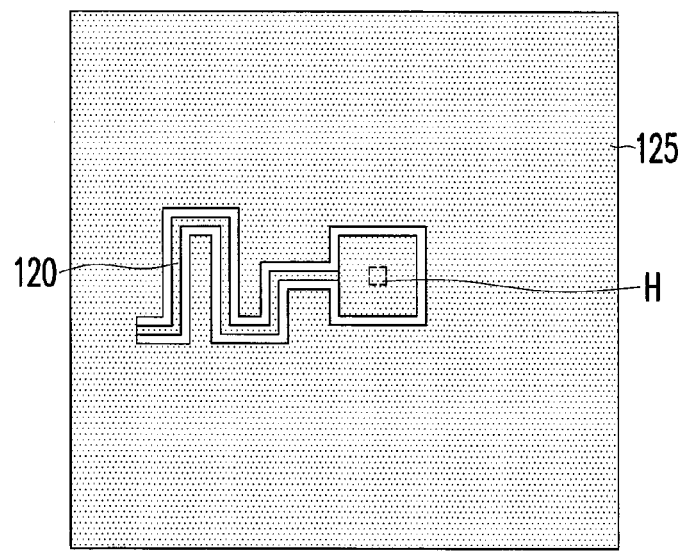
FIG. 3C is a schematic top view of a patterned transparent conductive layer and a transparent impedance line of the organic electroluminescent device in FIG. 3A.

FIG. 3A is a schematic top view of an organic electroluminescent device in the third embodiment of the present invention, and FIG. 3B is a cross-sectional view of the organic electroluminescent device in FIG. 3A along a cross-sectional line A-B. Referring to FIG. 3A and FIG. 3B, the organic electroluminescent device 10c includes a patterned transparent conductive layer 125, and a part of the patterned transparent conductive layer 125 overlaps the electrode line 110. The patterned transparent conductive layer 125 and the transparent impedance line 120 are located at the same layer, but the patterned transparent conductive layer 125 is only connected to one end of the transparent impedance line 120 away from the contact hole, where the patterned transparent conductive layer 125 is disposed in an area in the luminescent zone 115 surrounding the transparent impedance line 120, and a part of the patterned transparent conductive layer 125 overlaps the electrode line 110, as shown in FIG. 3A. For example, a transparent conductive material is formed first to completely cover the electrode line 110 and the luminescent zone 115, and then the transparent conductive material is etched to form the patterned transparent conductive layer 125 and the transparent impedance line 120, as shown in FIG. 3C. Hence, the current provided by the electrode line 110 follows the path of the transparent impedance line 120, and is transferred to the transparent electrode 140 in the luminescent zone 115 through the contact hole H in the insulating layer 130. The patterned transparent conductive layer 125 is electrically connected to the electrode line 110, so that the resistance of the current transfer path may be reduced to improve the luminance of the luminescent zone 115.

Fourth Embodiment

Figure 4:
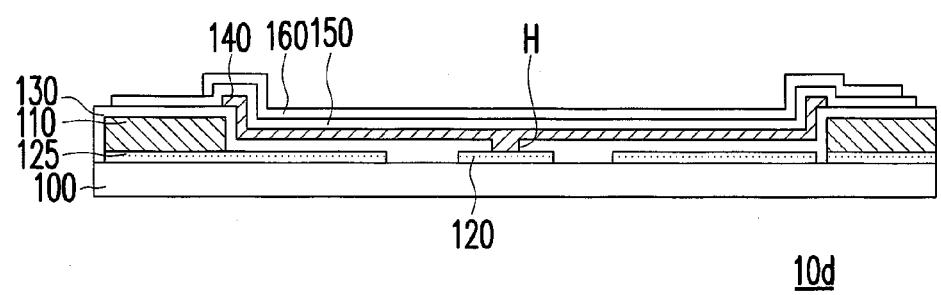
FIG. 4 is a schematic cross-sectional view of an organic electroluminescent device in a fourth embodiment of the present invention.

FIG. 4 is a schematic cross-sectional view of an organic electroluminescent device in the fourth embodiment of the present invention. Referring to FIG. 4, the organic electroluminescent device 10d of this embodiment is similar to the organic electroluminescent device 10c in the third embodiment described above, and the difference between the two lies in that in the organic electroluminescent device 10d of this embodiment, the patterned transparent conductive layer 125 and the transparent impedance line 120 are disposed on the substrate 100 first, the patterned transparent conductive layer 125 is disposed in an area of the luminescent zone 115 surrounding the transparent impedance line 120, and the electrode line 110 overlaps a part of the patterned transparent conductive layer 125. In other words, the patterned transparent conductive layer 125, the transparent impedance line 120, the electrode line 110, the insulating layer 130, and the transparent electrode 140, the organic illumination layer 150 and the electrode 160 in the organic luminescent unit are disposed in sequence on the substrate 100.

Based on the above, in the organic electroluminescent device of the present invention, the impedance of the entire organic electroluminescent device may be reduced by disposing a low-impedance electrode line on the substrate. The configuration of the transparent impedance line may limit a current flowing through the organic electroluminescent device to avoid a short circuit. In addition, the transparent electrode is disposed on the transparent impedance line and the insulating layer, and the current may pass through the transparent impedance line and the transparent electrode through the contact hole in the insulating layer, and as the material of the transparent impedance line is light transmissive, the aperture ratio of the organic electroluminescent device is increased. The patterned transparent conductive layer and the transparent impedance line may be formed at the same time to reduce the impedance of the entire organic electroluminescent device. In this way, the organic electroluminescent device of the present invention has low impedance, so that the luminance non-uniformity problem of the luminescent zone may be alleviated, and at the same time the aperture ratio of the organic electroluminescent device may be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An organic electroluminescent device, comprising:
   an electrode line, disposed on a substrate and next to a luminescent zone;
   a transparent impedance line, disposed in the luminescent zone on the substrate and electrically connected to the electrode line;
   an insulating layer, covering the substrate and having a contact hole in the luminescent zone;
   a transparent electrode, covering the luminescent zone and disposed on the insulating layer, wherein the transparent impedance line and the transparent electrode are electrically connected to each other through the contact hole, directly;
   an organic illumination layer, disposed on the transparent electrode and the transparent electrode is disposed between the organic illumination layer and the transparent impedance line; and an electrode, disposed on the organic illumination layer, wherein the contact hole is overlapped and covered by the transparent electrode, the organic illumination layer, and the electrode.

2. The organic electroluminescent device according to claim 1, wherein the electrode line is disposed on the substrate and contacts the transparent impedance line.

3. The organic electroluminescent device according to claim 1, wherein the insulating layer covers the transparent impedance line and the electrode line.

4. The organic electroluminescent device according to claim 1, wherein the transparent electrode, the organic illumination layer and the electrode are stacked in sequence on the insulating layer.

5. The organic electroluminescent device according to claim 1, wherein the transparent electrode is stacked above the transparent impedance line.

6. The organic electroluminescent device according to claim 1, further comprising a patterned transparent conductive layer, located at the same layer as the transparent impedance line and only connected to one end of the transparent impedance line away from the contact hole, wherein the patterned transparent conductive layer is disposed in an area in the luminescent zone surrounding the transparent impedance line, and the patterned transparent conductive layer contacts the electrode line.

7. The organic electroluminescent device according to claim 6, wherein the electrode line is disposed on the substrate and a part of the patterned transparent conductive layer overlaps the electrode line.

8. The organic electroluminescent device according to claim 6, wherein the patterned transparent conductive layer is disposed on the substrate and the electrode line overlaps a part of the patterned transparent conductive layer.

9. The organic electroluminescent device according to claim 1, wherein the material of the electrode line is metal or alloy.

10. The organic electroluminescent device according to claim 1, wherein the material of the transparent impedance line is indium tin oxide, indium zinc oxide, aluminum zinc oxide and indium gallium zinc oxide.

11. The organic electroluminescent device according to claim 1, wherein the material of the transparent electrode is indium tin oxide, indium zinc oxide, aluminum zinc oxide and indium gallium zinc oxide.

* * * * *

UNITED STATES PATENT AND TRADEMARK OFFICE
CERTIFICATE OF CORRECTION

PATENT NO. : 9,030,093 B2  
APPLICATION NO. : 13/717710  
DATED : May 12, 2015  
INVENTOR(S) : Chen-Chi Lin et al.

Page 1 of 1

It is certified that error appears in the above-identified patent and that said Letters Patent is hereby corrected as shown below:

On the title page, item 54 and in the specification, col. 1,

"ORGANIC ELECTROLUMINESCENT DEVICE AND TRANSPARENT IMPEDANCE LINE"

should be changed to --ORGANIC ELECTROLUMINESCENT DEVICE HAVING TRANSPARENT IMPEDANCE LINE--.

Signed and Sealed this
Thirteenth Day of October, 2015

Michelle K. Lee
*Director of the United States Patent and Trademark Office*